US010812033B2

(12) United States Patent
O'Brien et al.

(10) Patent No.: US 10,812,033 B2
(45) Date of Patent: Oct. 20, 2020

(54) HIGH-POWER RADIO-FREQUENCY SPIRAL-COIL FILTER

(71) Applicant: Lam Research Corporation, Fremont, CA (US)

(72) Inventors: Sean Kelly O'Brien, Pleasanton, CA (US); Seyed Jafar Jafarian-Tehrani, Fremont, CA (US); Hema Swaroop Mopidevi, Fremont, CA (US); Neil Martin Paul Benjamin, Palo Alto, CA (US); Jason Augustino, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/933,213

(22) Filed: Mar. 22, 2018

(65) Prior Publication Data

US 2019/0207579 A1    Jul. 4, 2019

Related U.S. Application Data

(60) Provisional application No. 62/612,015, filed on Dec. 29, 2017.

(51) Int. Cl.
*H03H 1/00*    (2006.01)
*H03H 7/01*    (2006.01)
(Continued)

(52) U.S. Cl.
CPC ....... *H03H 1/0007* (2013.01); *H01F 17/0013* (2013.01); *H01F 19/04* (2013.01);
(Continued)

(58) Field of Classification Search
CPC ......... H03H 1/0007; H03H 2001/0085; H03H 7/427; H01F 17/003; H01F 27/006; H01F 2027/2809
(Continued)

(56) References Cited

U.S. PATENT DOCUMENTS 6,380,608 B1 *   4/2002   Bentley ............... H01F 17/0013
                                                         257/3
6,453,842 B1 *   9/2002   Hanawa ............ H01J 37/32082
                                                       118/723 AN
(Continued)

OTHER PUBLICATIONS

"International Application Serial No. PCT US2018 065824, Written Opinion dated Apr. 11, 2019", 8 pgs.
(Continued)

*Primary Examiner* — Rakesh B Patel
(74) *Attorney, Agent, or Firm* — Schwegman Lundberg & Woessner, P.A.

(57) ABSTRACT

Various embodiments include an apparatus to filter radio-frequencies in a plasma-based processing device. In various embodiments, an RF filter device includes a number of substantially-planar spiral-filters electrically coupled to and substantially parallel to each other in a spaced-apart arrangement. In one embodiment, each of the planar spiral-filters is coupled to an adjacent one of the planar spiral filters as either an inside-to-inside electrical connection or an outside-to-outside electrical connection based on an arrangement of the successive spirals so as to increase a total value of inductance. Other methods, devices, apparatuses, and systems are disclosed.

24 Claims, 5 Drawing Sheets

(51) Int. Cl.
*H01F 27/28* (2006.01)
*H01F 27/24* (2006.01)
*H01J 37/00* (2006.01)
*H01F 19/04* (2006.01)
*H01F 17/00* (2006.01)
*H01F 27/00* (2006.01)
*H01J 37/32* (2006.01)
*H01L 21/683* (2006.01)

(52) U.S. Cl.
CPC .......... *H01F 27/006* (2013.01); *H01F 27/24* (2013.01); *H01F 27/28* (2013.01); *H01F 27/2871* (2013.01); *H01J 37/00* (2013.01); *H03H 7/01* (2013.01); *H01F 27/2823* (2013.01); *H01F 2027/2809* (2013.01); *H01J 37/32174* (2013.01); *H01L 21/6831* (2013.01); *H03H 2001/0092* (2013.01)

(58) Field of Classification Search
USPC .......................................... 333/185; 336/200
See application file for complete search history.

(56) References Cited

U.S. PATENT DOCUMENTS

| | | | | |
|---|---|---|---|---|
| 6,847,282 B2* | 1/2005 | Gomez | ............... | H01F 17/0013 336/200 |
| 2004/0135652 A1* | 7/2004 | Uchida | ............... | H01F 17/0013 333/185 |
| 2005/0200431 A1 | 9/2005 | Lin et al. | | |
| 2007/0194268 A1* | 8/2007 | Endo | .................... | C01G 53/006 252/62.56 |
| 2007/0284344 A1* | 12/2007 | Todorov | ............ | H01J 37/32706 219/121.54 |
| 2009/0115562 A1* | 5/2009 | Lee | ..................... | H01F 17/0006 336/200 |
| 2011/0133879 A1 | 6/2011 | Chiu et al. | | |
| 2011/0245644 A1* | 10/2011 | Stevenson | ................ | A61B 5/04 600/372 |
| 2014/0354377 A1* | 12/2014 | Gupta | ................. | H01F 17/0013 333/185 |
| 2015/0371759 A1 | 12/2015 | Barry et al. | | |
| 2016/0028362 A1 | 1/2016 | Jafarian-Tehrani | | |
| 2016/0079038 A1* | 3/2016 | Okunishi | ................. | H03H 7/38 315/111.21 |
| 2017/0069464 A1 | 3/2017 | Ye et al. | | |

OTHER PUBLICATIONS

"International Application Serial No. PCT US2018 065824, International Search Report dated Apr. 11, 2019", 3 pgs.

International Application Serial No. PCT/US2018/065824, International Preliminary Report on Patentability dated Jul. 9, 2020, 10 pgs.

* cited by examiner

HIGH-POWER RADIO-FREQUENCY SPIRAL-COIL FILTER

CLAIM OF PRIORITY

This application claims the benefit of priority under 35 U.S.C. § 119(e) to U.S. Provisional Patent Application Ser. No. 62/612,015, filed on Dec. 29, 2017, which is incorporated by reference herein in its entirety.

TECHNICAL FIELD

The subject matter disclosed herein relates to coils for blocking high-power radio-frequency (RF) signals in plasma-processing systems.

BACKGROUND

Traditionally, coils for use with low RF frequencies employ ferromagnetic cores to reduce the length and volume of an inductor coil. However, the person of ordinary skill in the art recognizes that ferromagnetic materials have frequency-dependent electrical, magnetic, and thermal properties. Further, coils designed using these ferromagnetic cores have been shown to provide poor performance repeatability unless strict engineering guidelines are incorporated. These strict guidelines increase the cost of coil production. Also, custom-machined ferromagnetic structures, if needed, further raise the cost of production. As an alternative to coils with ferromagnetic cores, coils with larger air-cores can be used. However, the air-core coils are typically much larger than the ferromagnetic-core based equivalents. Therefore, air-core coils can traditionally only be used in situations where space constraints do not present a problem.

Next-generation etch-tool requirements, as well as other process tools, are requiring additional performance characteristics within almost the same form factor as contemporaneous etch-tools. Therefore, traditional air-core coils cannot generally be justified because of their increased physical size. Consequently, a compact solution for RF frequency coils that is also suitable for high power applications would be desirable. The information described in this section is given to provide the skilled artisan a context for the following disclosed subject matter and should not be considered as admitted prior art.

DETAILED DESCRIPTION

Figure 1:
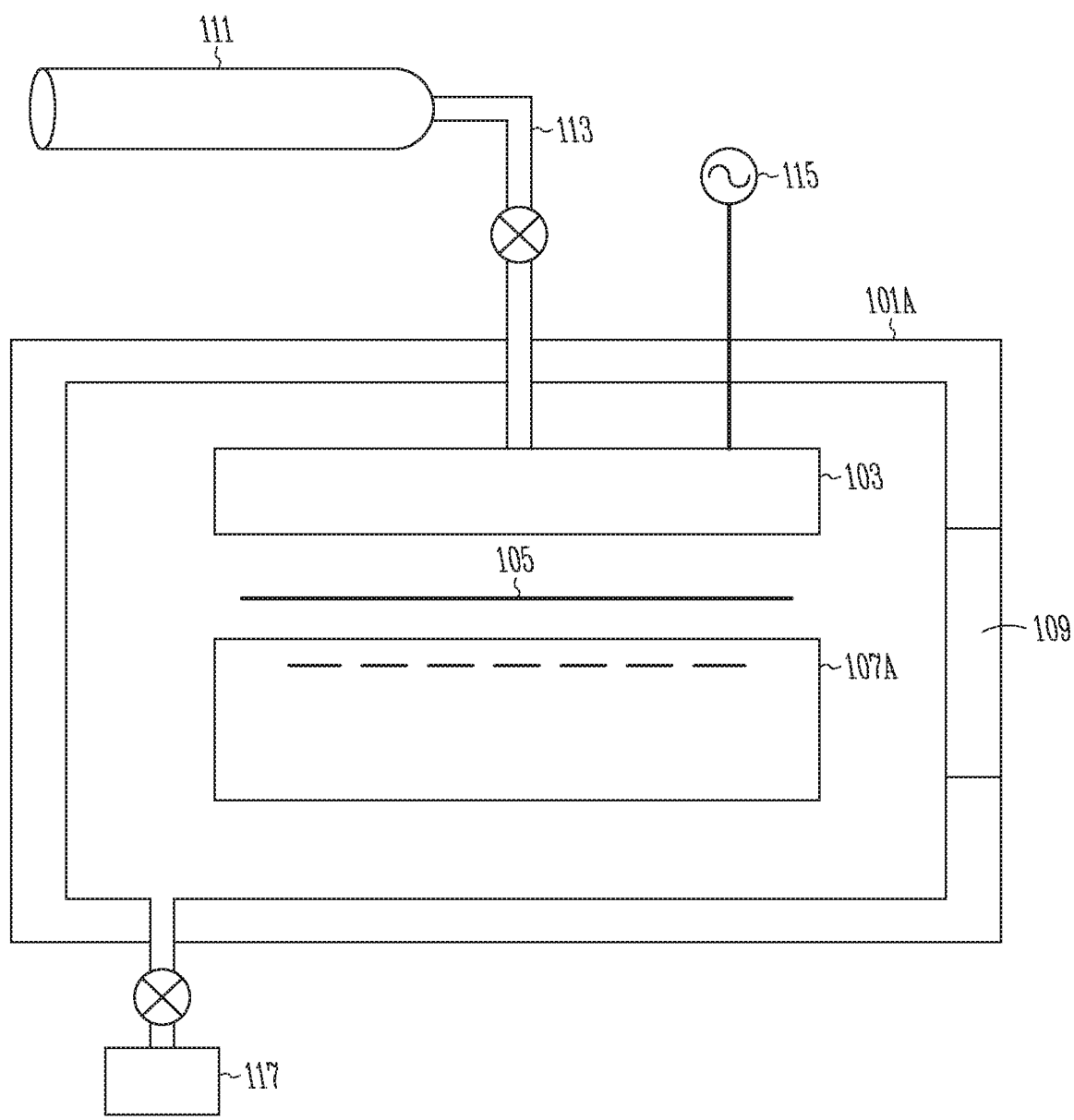
FIG. 1 shows a simplified example of a plasma-based processing chamber, which can include a substrate support assembly comprising an electrostatic chuck (ESC)

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well known process steps or structures have not been described in detail so as not to obscure the disclosed subject matter.

The disclosed subject matter contained herein describes a high-power (e.g., about 500 W to about 50 kW) inductor coil that acts as an RF blocking filter (alternatively referred to herein as an RF filter). The RF filter presents a high impedance to a source side at the frequencies of interest. Consequently, the RF filter is a good attenuator from a perspective of a load side. Generally, to accomplish these goals at the frequencies of interest, either a larger diameter inductor or an inductor with a lot more turns is used. In order to maintain a relatively compact size, the RF filter described herein comprises one or more stacked, substantially planar coils. In embodiments, the RF filter is primarily used to block RF from entering AC circuitry which supplies power to heaters of an electrostatic chuck (ESC) that handles various substrate-types during processing. As is understood by the skilled artisan, ESC heaters provide an important control to maintain a temperature profile of the process which ultimately leads to better uniformity and etch-rates on a substrate.

Traditionally, coils for use at low RF frequencies depend on ferromagnetic cores (including one or more ferrites such as nickel-zinc ferrite (NiZn), manganese-zinc ferrite (MnZn), magnesium-zinc ferrite (MgZn), nickel-magnesium ferrite (NiMg), steel bars, powdered iron, etc.). The ferromagnetic core reduces the length and physical size of an inductor coil. It is well known that ferromagnetic material has frequency dependent electrical, magnetic, and thermal properties and has been shown to provide a poor repeatability performance unless strict engineering guidelines are incorporated. These guidelines usually increase the cost of material. Also, custom-machined ferromagnetic structures tend to raise the cost of production.

Alternatively, larger air-core coils can be designed but the size of an air-core coil can be significantly larger than a comparable coil having a ferromagnetic core with the same inductance value as the air-core coil. Consequently, an air-core coil cannot typically be used when there are space constraints (e.g., the coil must fit into an existing enclosure located proximate a processing system).

The RF filter disclosed herein may be constructed with or without any type of ferromagnetic core and therefore can be formed with only an air core. However, the RF filter can also be formed to conform to any spatial constraints of RF filter enclosures in existing plasma-processing systems. Next-generation etch-tool requirements are driving for additional performance characteristics within almost the same form-fit-function use of contemporaneous plasma-processing tools. Therefore, the increased size of a traditional air-core cannot generally be justified. Consequently, a solution would be desirable in which certain inductance levels are specified in an RF filter having a compact form factor while, concurrently, the RF filter must also be suitable for high-power applications (e.g., about 500 W to about 50 kW).

Therefore, various embodiments are described in detail, below, including methods and techniques for designing the RF filter having a compact form factor that may be used in high-power applications. Further, the disclosed subject matter also describes apparatuses for practicing embodiments of the disclosed subject matter. One or more embodiments of the disclosed subject matter are related to a filter for filtering radio frequency (RF) power produced within a plasma-based processing system. The RF power may be transmitted from, for example, at least an electrostatic chuck (ESC) in the plasma-based processing system. The plasma-based processing system may include a first heating element disposed at a first portion of the ESC and a second heating element disposed at a second portion of the ESC. The plasma-based processing system may further include a power supply, such as an alternating current (AC) power supply, for powering the heating elements. The RF filter may filter or block RF power from being transmitted in one direction (thereby minimizing electromagnetic compatibility (EMC) failure, interference issues, and/or power loss issues) and may allow AC power (50 Hz or 60 Hz) to be transmitted in another direction to the heating elements. The RF filter may therefore eliminate or reduce EMC failure, interference issues, and power loss issues that may be caused by RF power being directed or transmitted improperly to certain components of the plasma-based processing system.

With reference now to FIG. 1, a simplified example of a plasma-based processing chamber is shown. FIG. 1 is shown to include a plasma-based processing chamber 101A in which a showerhead electrode 103 and a substrate-support assembly 107A are disposed. Typically, the substrate-support assembly 107A provides a substantially-isothermal surface and may serve as both a heating element and a heat sink for a substrate 105. The substrate-support assembly 107A may comprise an ESC in which heating elements are included to aid in processing the substrate 105, as described above. As understood by a person of ordinary skill in the art, the substrate 105 may be a wafer comprising elemental semiconductors (e.g., silicon or germanium), a wafer comprising compound elements (e.g., gallium arsenide (GaAs) or gallium nitride (GaN)), or variety of other substrate types known in the art (including conductive, semiconductive, and non-conductive substrates).

In operation, the substrate 105 is loaded through a loading port 109 onto the substrate-support assembly 107A. A gas line 113 supplies one or more process gases to the showerhead electrode 103. In turn, the showerhead electrode 103 delivers the one or more process gases into the plasma-based processing chamber 101A. A gas source 111 to supply the one or more process gases is coupled to the gas line 113. An RF power source 115 is coupled to the showerhead electrode 103.

In operation, the plasma-based processing chamber 101A is evacuated by a vacuum pump 117. RF power is capacitively coupled between the showerhead electrode 103 and a lower electrode (not shown explicitly) contained within or on the substrate-support assembly 107A. The substrate-support assembly 107A is typically supplied with two or more RF frequencies. For example, in various embodiments, the RF frequencies may be selected from at least one frequency at about 1 MHz, 2 Mhz, 13.56 MHz, 27 MHz, 60 MHz, and other frequencies as desired. However, upon reading and understanding the disclosure provided herein, the person of ordinary skill in the art will recognize that a coil required to block or partially block a particular RF frequency can be designed as needed. Therefore, particular frequencies discussed herein are provided merely for ease in understanding. The RF power is used to energize the one or more process gases into a plasma in the space between the substrate 105 and the showerhead electrode 103. As is known in the relevant art, the plasma can assist in depositing various layers (not shown) on the substrate 105. In other applications, the plasma can be used to etch device features into the various layers on the substrate 105. As noted above, the substrate-support assembly 107A may have heaters (not shown) incorporated therein. A person of ordinary skill in the art will recognize that, while the detailed design of the plasma-based processing chamber 101A may vary, RF power is coupled through at least the substrate-support assembly 107A.

Figure 2:
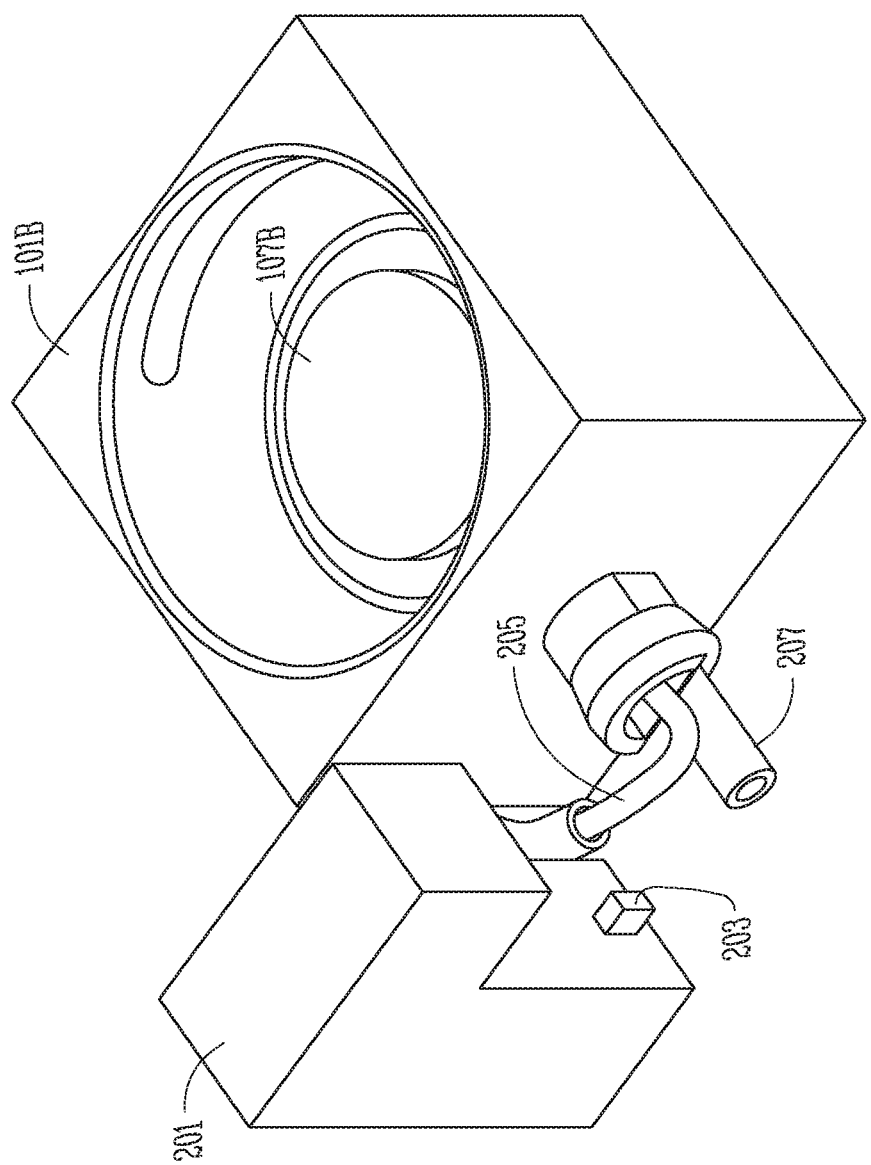
FIG. 2 shows an example of a three-dimensional (3D) representation illustrating several components of the plasma-based processing system of FIG. 1.

Referring now to FIG. 2, a three-dimensional (3D) representation illustrating several components of the plasma-based processing system of FIG. 1 is shown. A chamber portion 101B of the plasma-based processing chamber 101A of FIG. 1 is shown to include an RF-filter enclosure 201, an alternating current (AC) connector 203, a power cable 205, and an RF power feed cable 207. An uppermost portion 107B of the substrate-support assembly 107A of FIG. 1 is also shown. As noted above, the substrate-support assembly 107A may include an ESC.

In various embodiments, the ESC may be a tunable ESC (TESC) capable of a tunable temperature control in two-zones on the uppermost portion 107B of the substrate-support assembly 107A. The temperature-tuning capability of the ESC may be achieved by implementing two electric heating elements (shown as dashed lines in the substrate-support assembly 107A of FIG. 1) embedded under an uppermost portion of the ESC, proximate to the substrate 105. In the case of a two-zone TESC, one electric heating element is implemented for each of the two zones.

The electric heating elements may be powered by alternating current (AC) supplied by an AC power supply (not shown in the figures) through an AC connector 203 through the RF-filter enclosure 201 and the power cable 205. The RF-filter enclosure 201 also contains an RF filter (not shown in FIG. 2 but described in detail below with reference to FIGS. 3 and 4) to prevent or reduce RF power from being delivered to the electric heating elements. The temperature of each of the electric heating elements may be controlled by techniques well-known in the art.

With concurrent reference to FIGS. 1 and 2, during operation of the plasma-based processing chamber 101A, RF power is supplied to the substrate-support assembly 107A (ESC) through the RF power feed cable 207 (not shown in FIG. 1), as well as to the showerhead electrode 103, from the RF power source 115. The ESC therefore serves as a lower electrode. Equipotential field lines are set up over the substrate 105 between the substrate 105 and the showerhead electrode 103. During plasma processing, positive ions accelerate across the equipotential field lines to impinge on the surface of the substrate 105, thereby providing the desired etch effect, such as improving etch directionality (the person of ordinary skill in the art will recognize any appropriate modifications needed for film deposition as opposed to etch).

Figure 3:
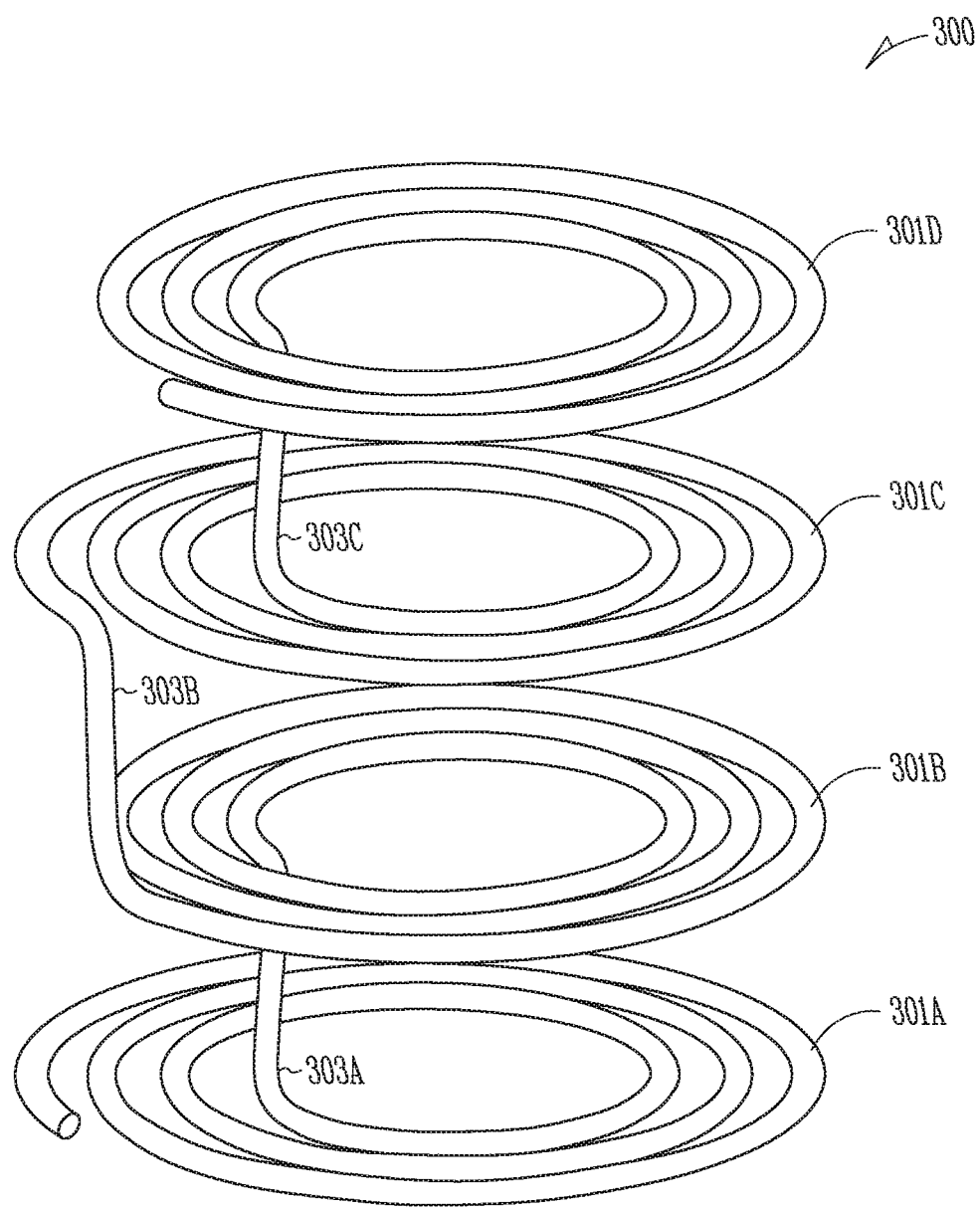
FIG. 3 shows an example of a 3D representation of four stacked spiral RF-filters in accordance with various embodiments of the disclosed subject matter.

Referring now to FIG. 3, a 3D representation of four stacked spiral RF-filters 300 is shown. The z-axis is exaggerated to show connections between successive ones of the spirals. FIG. 3 is shown to include a first 301A, a second 301B, a third 301C, and a fourth 301D spiral RF-filters. Each of the spiral RF-filters is substantially planar and is substantially parallel to a subsequent one of the RF filters. For example, in one embodiment, "substantially planar" and "is substantially parallel to" may be interpreted as meaning that elements within the spiral RF-filter and filter-to-filter are within about 0° to about 5°, respectively, to each other. In various embodiments, "substantially planar" and "is substantially parallel to" may be interpreted as meaning that elements within the spiral RF-filter and filter-to-filter are within about 0° to about 10°, respectively, to each other. In various embodiments, "substantially planar" and "is substantially parallel to" may be interpreted as meaning that elements within the spiral RF-filter and filter-to-filter are within about 0° to about 30°, respectively, to each other. A skilled artisan will recognize, based on the disclosure provided herein, an appropriate meaning for the terms "substantially planar" and "is substantially parallel to." Further, upon reading and understanding the disclosure provided herein, the skilled artisan will recognize that more spiral RF-filters or fewer spiral RF-filters may be utilized depending on a total impedance value appropriate for a given situation and design parameters.

As described in more detail below, each of the spiral RF-filters 301A-301D is alternately coupled to the successive spiral RF-filter on either the inside edge of the spiral or the outside edge of the spiral. For example, the first spiral RF-filter 301A is connected to the second spiral RF-filter 301B on an inside edge 303A, the second spiral RF-filter 301B is connected to the third spiral RF-filter 301C on an outside edge 303B, and the third spiral RF-filter 301C is connected to the fourth spiral RF-filter 301D on an inside edge 303C. Consequently, the four stacked spiral RF-filters 300 are stacked on top of each other. As explained in more detail below, this arrangement provides a compact solution that also provides enough inductance to block low-frequency RF power.

With continuing reference to FIG. 3, the alternating inside-to-inside and outside-to-outside connections 303A-303C serve to provide constructively interfering magnetic paths, thereby increasing the total inductance of a coil. As used herein, a coil may be considered to be the same as a spiral RF-filter. If the arrangement as shown in the connections 303A-303C of FIG. 3 is not employed, a resultant configuration may cancel at least portions of the magnetic field, thereby increasing eddy current losses, and reducing a total inductance of a coil. However, in various embodiments, and although not shown explicitly but readily understandable to a person of ordinary skill in the art, constructive interference between the coils may be realized by winding only alternating layers of the spirals in the same direction (e.g., either clockwise or counter-clockwise). Therefore, adjacent layers of the spirals are wound in opposite directions from each other. The spirals are then connected, for example, from the inside terminal of the first coil to the outside terminal of the next coil, and so on. Overall, the number of spiral RF-filters can be designed based on the frequency of operation.

In various embodiments, each of the various spiral RF-filters may take different forms. For example, the spirals may be wound such that the pitch may be substantially constant (e.g., have substantially parallel curves) from one portion of the spiral to an adjacent portion of the spiral. In other embodiments, the spirals may be wound such that the pitch may be variable (e.g., increasing or decreasing or some combination thereof) from one portion of the spiral to an adjacent portion of the spiral. In still other embodiments, other geometric variations in the pitch of successive spirals may be considered (e.g., an approximation of an Archimedean spiral).

Also, in various embodiments, the z-spacing (e.g., with reference to FIG. 3) between adjacent ones of the individual spiral RF-filters may be adjusted to change a total inductance value of the stacked spiral RF-filters. In addition to changing the spacing to design an RF filter with desired electrical characteristics, the spacing can be adjusted to accommodate physical parameters, such as, for example, cooling requirements. Having a large spacing between adjacent ones of the spiral RF-filter, or a larger pitch from one coil portion within the spiral RF-filter to another coil portion, may allow for an increase in cooling (e.g., by passive or forced air being moved past the coils to increase convective cooling).

Upon reading and understanding the disclosure provided herein, a person of ordinary skill in the art will recognize that the gauge of wire, and material from which the wire is formed, can be chosen for a given set of electrical parameters, such as voltage, current, and, consequently, total power carried within the spiral RF-filter. For example, an aggregate size of 14-gauge copper wire may adequately handle a current of 15 amps but a 10-gauge wire (aggregate size) may be needed for a current of 30 amps and a 6-gauge wire (aggregate size) for a current of 50 amps. Additionally, the number of wires per spiral (e.g., a twisted-wire formation technique) can be varied for a given filter design. Such twisted-wire formation techniques are known in the art.

In various embodiments, each of the individual wires may be coated with an insulative material, such as a coating formed on the wire. Such coatings are known in the art.

Upon reading and understanding the disclosure provided herein, a person of ordinary skill in the art will recognize that, for a given form factor (overall physical size or aspect ratios), power levels within the plasma-based processing system, frequency or frequencies employed by the system, various ones of the above-mentioned variables (e.g., sizes, pitches, materials, etc.) can be changed for a desired design.

Consequently, various embodiments of the RF filter may transmit AC power for powering the electric heating elements. The RF filter may also minimize or block RF power from being transmitted from the ESC to other components outside of the plasma-based processing chamber 101A (see FIG. 1), for reducing or minimizing the above-mentioned EMC failure issues, interference issues, and power loss issues.

The disclosed subject matter is significant improvement over various technologies, such as non-spiral (i.e., traditional) solenoids, that are well-known in the art. However, these technologies have not previously been applied to high-power-plasma processing systems in a high-power domain as a compact form-factor. Further, various forms of coils employed in the art have failed to recognize the alternating inside-to-inside and outside-to-outside connections 303A through 303C to provide constructively interfering magnetic paths as disclosed herein. Consequently, an inner portion (e.g., connection point) of one planar coil is connected to an inner portion of an adjacent coil, the outer portion of a subsequent coil is connected to the outer portion of a subsequent planar coil, and so forth. Therefore, each of the planar coils is wound in the same direction from the perspective of a given end of the coil (e.g., all are wound clockwise or all are wound counter-clockwise (anti-clockwise)). Overall, a significantly higher amount of inductance is achievable in a relatively small volume.

Figure 4:
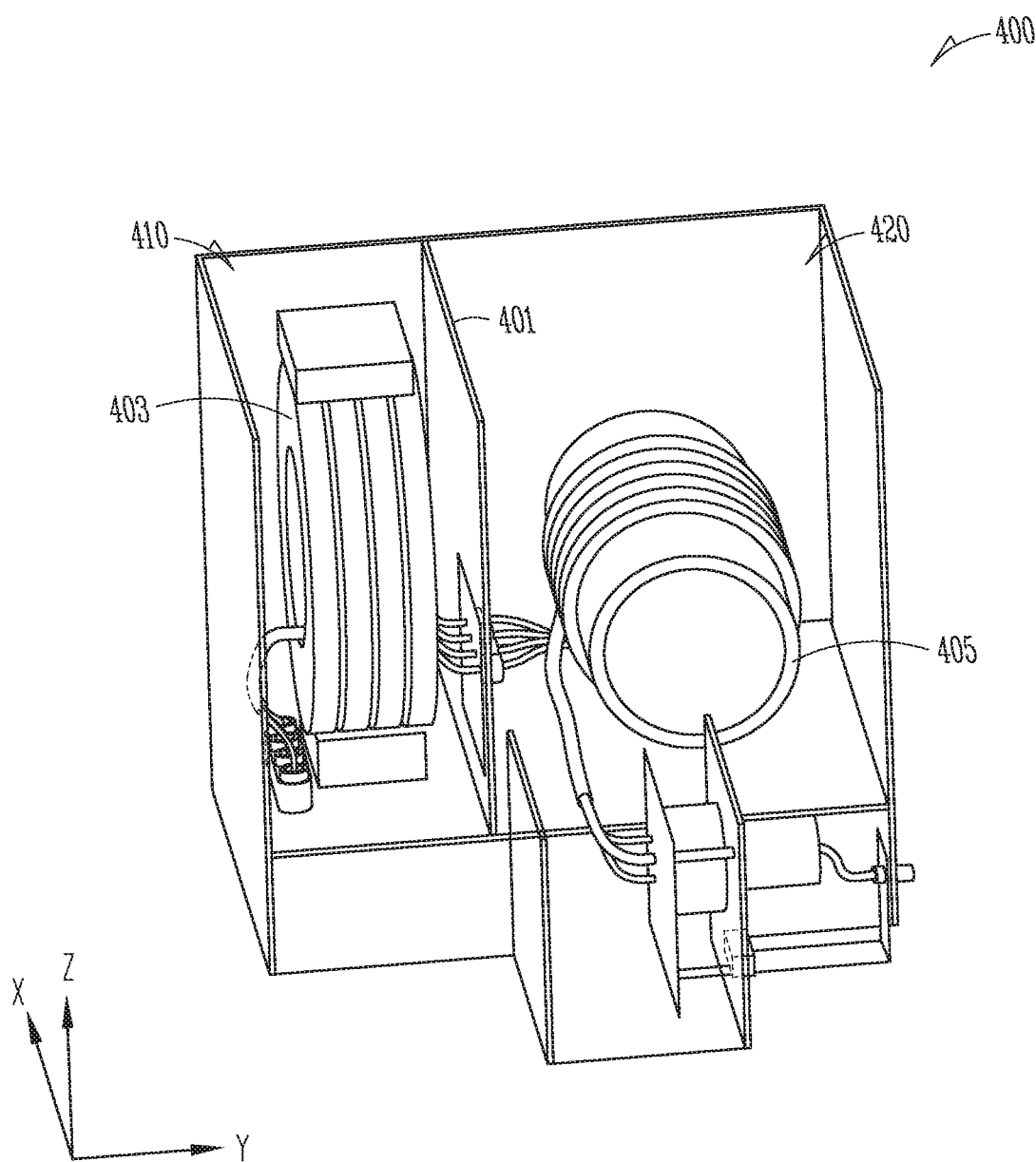
FIG. 4 shows an example cutaway 3D representation of a filter model showing the use of a stacked spiral RF-filter and a traditional solenoid RF-filter, the stacked spiral RF-filter being in accordance with the example of FIG. 3.

With reference now to FIG. 4, an example of a cutaway 3D representation of a filter model 400 is shown that employs a stacked spiral RF-filter, in accordance with the example of FIG. 3. The filter model 400 shown in FIG. 4 is capable of filtering both high-frequency RF signals (e.g., from about 4 MHz to about 100 MHz) and low-frequency RF signals (e.g., from about 100 kHz to about 3 MHz) RF power with the help of such a coil. The filter model 400 is shown to include a first filter enclosure volume 410, a second filter enclosure volume 420, and a partition wall 401 situated between the first and second (i.e., low-frequency and high-frequency, respectively) enclosure volumes 410, 420. The first filter enclosure volume 410 has a stacked spiral RF-filter 403 contained therein. The stacked spiral RF-filter 403 has "n" layers (where n is an integral number greater than or equal to "1") of stacked spiral coils in accordance with FIG. 3 and the accompanying description above. The second filter enclosure volume 420 has a traditional RF-filter (e.g., solenoid) 405 contained therein.

Figure 5:
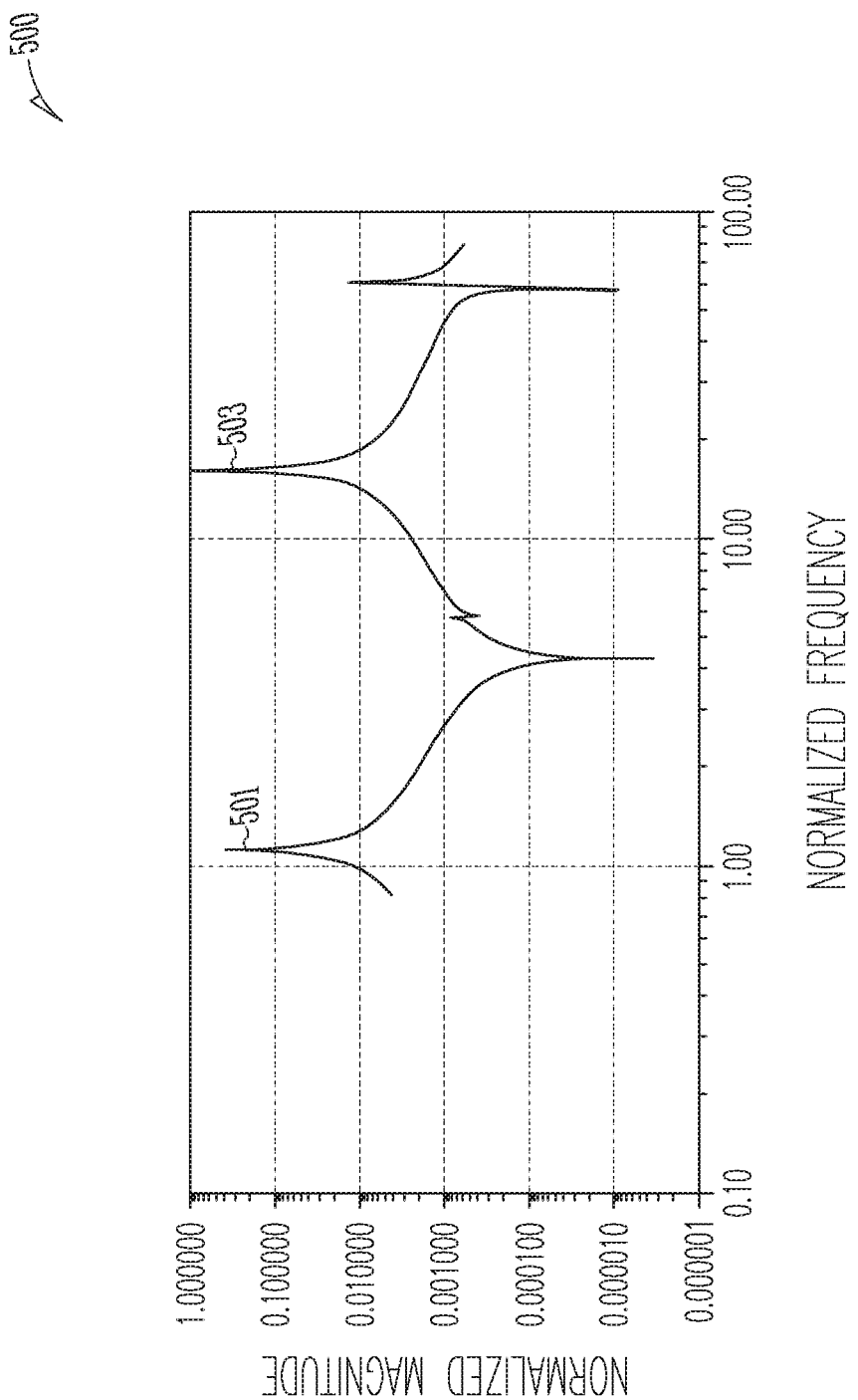
FIG. 5 shows an example of a normalized magnitude impedance response graph of a dual-frequency RF-filter, in accordance with the filter model of FIG. 4, as a function of normalized frequency.

FIG. 5 shows an example of a normalized-magnitude impedance-response graph 500 of the dual-frequency RF-filter, in accordance with the filter model of FIG. 4. The normalized magnitude of impedance, on the ordinate axis, is shown as a function of normalized frequency, on the abscissa. The normalized-magnitude impedance-response graph 500 shows an impedance of a low-frequency component response curve portion 501 and an impedance of a high-frequency component response curve portion 503, both as a function of normalized frequency. The normalized-magnitude impedance-response graph 500 indicates highly-favorable RF-rejection performance at both frequencies while maintaining the form-fit-function requirements for the particular enclosure as shown in the example of FIG. 4.

As discussed above, the ordinate axis and the abscissa of the normalized-magnitude impedance-response graph 500 is normalized with respect to impedance and frequency, respectively. In a specific exemplary embodiment, a magnitude of impedance can range from about 500 ohms and about 10 kOhms, depending on the actual implementation of the RF filters.

Another factor for designing the RF filter for multi-channel operations, as discussed above, is also dependent on a particular implementation of twisted-wire technology. An implementation of the twisted-wire technology can be a factor to consider in balancing channel-to-channel inductance magnitudes. With regard to the stacked spiral RF-filters as shown and described with reference to FIG. 3, above, obtaining a good mutual inductance between channels allows the coil inductance to be considered as one winding rather than several separate channels electrically coupled in parallel. The good mutual inductance can also reduce or minimize undesired parasitic resonances. Parasitic resonances may make the RF filter less effective or problematic in plasma- or harmonic/inter-modulation distortion (IMD)-generating systems.

Overall, the disclosed subject matter has a number of advantages over contemporaneous RF-filter designs. The advantages include, for example, (1) no necessary reliance on ferromagnetic material cores, thereby eliminating or reducing core saturation issues as well better repeatability from one manufactured unit to the next; (2) combinations of one or more ferromagnetic material can be implemented in certain designs; (3) compact design (e.g., small form factor to fit existing RF-filter enclosures) even though coupled with high-power solution (even when implemented as an air-core design; and (4) the air-core design allows effective convective heat transfer by air cooling to reduce or eliminate heat from resistive heating of the wire in the spirals.

Hence, spirals (e.g., substantially planar spirals) stacked on top of one another is a compact solution that also provides enough inductance to block low-frequency RF power. The spirals are alternately connected from inside-to-outside (see FIG. 3) to provide constructively interfering magnetic paths that increases a total inductance of the spirals as described above. The number of spiral layers can be designed based on the frequency of operation. The aspect-ratio of the spiral RF-filter structure can be designed as appropriate for particular physical and electrical considerations. As noted herein, the design of the RF filter depends on a number of factors including, for example, power-handling capability, wire-current handling capacity, frequency of operation, tolerable RF-parasitic effects, high-voltage guidelines, and heat-dissipation requirements. The design of this RF filter may use well-known standard formulas for solenoid coil designs for a starting point but need not follow the standard formulas as the RF filter is a custom-design. As such, the RF filter described herein may be used in an RF sub-system development of semiconductor capital equipment and may follow a complex set of radio-frequency, mechanical, form-fit-function, and high-voltage guidelines as discussed herein. Further, the RF filter described herein can also be used in combination with ferromagnetic materials including ferrites of NiZn, MnZn, MgZn, NiMg, steel bars, powdered iron, and other materials known in the art, or a combination thereof for particular designs.

Therefore, the description above includes illustrative examples, devices, systems, and methods that embody the disclosed subject matter. In the description, for purposes of explanation, numerous specific details were set forth in order to provide an understanding of various embodiments of the disclosed subject matter. It will be evident, however, to those of ordinary skill in the art that various embodiments of the subject matter may be practiced without these specific details. Further, well-known structures, materials, and techniques have not been shown in detail, so as not to obscure the various illustrated embodiments.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other particulate matter sensor calibration system embodiments discussed herein.

Consequently, many modifications and variations can be made, as will be apparent to the person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A radio-frequency (RF) filter device, comprising:
   a plurality of substantially-planar spiral-filters electrically coupled to each other in a spaced-apart arrangement, each of the plurality of substantially-planar spiral-filters being coupled alternately to an adjacent one of the substantially-planar spiral-filters in an inside-to-inside electrical connection and an outside-to-outside electrical connection, the alternating inside-to-inside and outside-to-outside connections to provide constructively-interfering magnetic paths, the plurality of substantially-planar spiral-filters being arranged in a successive configuration, each of the substantially-planar spiral-filters being wound in a same direction from a perspective of a given end of the coil; and
   a solenoid RF filter, the solenoid RF filter being electrically coupled to the plurality of substantially-planar spiral-filters, an orientation of a winding axis of the plurality of substantially-planar spiral-filters being substantially transverse to a winding axis of the solenoid RF filter, the RF filter device being configured to be coupled to a plasma-based processing system.

2. The radio-frequency filter device of claim 1, wherein the substantially-planar spiral-filters are stacked substantially parallel to one another.

3. The radio-frequency filter device of claim 2, wherein the substantially-planar spiral-filters further comprise an air core.

4. The radio-frequency filter device of claim 2, wherein the substantially-planar spiral-filters further comprise a ferromagnetic core material.

5. The radio-frequency filter device of claim 1, wherein each of the substantially-planar spiral-filters comprises a twisted-wire formation capable of handling from about 500 watts to about 50 kilowatts.

6. The radio-frequency filter device of claim 1, wherein the plurality of substantially-planar spiral-filters provide an impedance value from about 500 ohms to about 10 kiloohms.

7. The radio-frequency filter device of claim 1, wherein the plurality of substantially-planar spiral-filters reduce a low-frequency RF power in a range of about 100 kHz to about 3 MHz.

8. The radio-frequency filter device of claim 1, wherein distances between adjacent ones of the plurality of substantially-planar spiral-filters are substantially equal.

9. The radio-frequency filter device of claim 1, wherein distances between adjacent ones of the plurality of substantially-planar spiral-filters vary.

10. The radio-frequency filter device of claim 9, wherein the distances between adjacent ones of the plurality of substantially-planar spiral-filters vary to increase convective cooling from each of the substantially-planar spiral-filters.

11. The radio-frequency filter device of claim 9, wherein the distances between adjacent ones of the plurality of substantially-planar spiral-filters vary to change a total value of inductance of the RF filter device.

12. The radio-frequency filter device of claim 1, wherein a pitch of at least one of the plurality of substantially-planar spiral-filters is radially uniform in all portions of the spiral filter.

13. The radio-frequency filter device of claim 1, wherein a pitch of at least one of the plurality of substantially-planar spiral-filters is different from a pitch of an adjacent one of the plurality of substantially-planar spiral-filters.

14. The radio-frequency filter device of claim 1, wherein a pitch of at least one of the plurality of substantially-planar spiral-filters varies radially from one section of the spiral filter to another section.

15. A system, comprising:
   a low-frequency radio-frequency (RF) filter to couple to an electrostatic chuck in a plasma-based processing system, the RF filter to substantially block RF frequencies in a range of frequencies from about 100 kHz to about 3 MHz, the RF filter having a plurality of substantially-planar spiral filters electrically coupled to each other in a spaced-apart arrangement, each of the substantially-planar spiral filters being coupled alternately to an adjacent one of the substantially planar spiral filters in an inside-to-inside electrical connection and an outside-to-outside electrical connection, the alternating inside-to-inside and outside-to-outside connections to provide constructively-interfering magnetic paths, the plurality of substantially-planar spiral-filters being arranged in a successive configuration, each of the substantially-planar spiral-filters being wound in a same direction from a perspective of a given end of the coil; and
   a high-frequency RF filter in a solenoid arrangement to substantially block RF frequencies above about 3 MHz, the high-frequency RF filter electrically coupled to the low-frequency RF filter, an orientation of a winding axis of the plurality of substantially-planar spiral-filters being substantially transverse to a winding axis of the high-frequency RF filter.

16. The system of claim 15, wherein the low-frequency RF filter and the high-frequency RF filter are physically sized to be placed within an RF-filter enclosure in the plasma-based processing system.

17. The system of claim 15, wherein each of the substantially-planar spiral filters includes a first portion and a second portion; and wherein each of the substantially-planar spiral filters has a substantially constant pitch having substantially-parallel curves from the first portion to the second portion.

18. The system of claim 15, wherein each of the substantially-planar spiral filters includes a first portion and a second portion; and wherein each of the planar spiral filters has a varying pitch from the first portion to the second portion.

19. The system of claim 15, wherein a pitch of each of the substantially-planar spiral filters approximates an Archimedean spiral.

20. A device comprising a low-frequency radio-frequency (RF) filter to substantially block RF frequencies in a range of frequencies from about 100 kHz to about 3 MHz and at a power level from about 500 watts to about 50 kilowatts, the RF filter having a plurality of substantially-planar spiral-filters arranged as an air-core device, each of the plurality of substantially-planar spiral-filters being coupled alternately to an adjacent one of the substantially-planar spiral-filters in an inside-to-outside electrical connection and an outside-to-inside electrical connection, the alternating inside-to-inside and outside-to-outside connections to provide constructively-interfering magnetic paths, the plurality of substantially-planar spiral-filters being arranged in a successive configuration, each of the substantially-planar spiral-filters being wound in a same direction from a perspective of a given end of the coil; and a solenoid RF filter, the solenoid RF filter being electrically coupled to the plurality of substantially-planar spiral-filters, an orientation of a winding axis of the plurality of substantially-planar spiral-filters being substantially transverse to a winding axis of the solenoid RF filter, the RF filter device being configured to be coupled to a plasma-based processing system.

21. A radio-frequency (RF) filter device, comprising:

a plurality of substantially-planar spiral filters electrically coupled to and parallel to each other in a spaced-apart arrangement, each of the substantially-planar spiral filters being coupled alternately to an adjacent one of the substantially planar spiral filters in an inside-to-inside electrical connection and an outside-to-outside electrical connection, the alternating inside-to-inside and outside-to-outside connections to provide constructively-interfering magnetic paths, the plurality of substantially-planar spiral-filters being arranged in a successive configuration, each of the substantially-planar spiral-filters being wound in a same direction from a perspective of a given end of the coil, each of the plurality of substantially-planar spiral filters having a twisted-wire formation capable of handling from about 500 watts to about 50 kilowatts; and a solenoid RF filter, the solenoid RF filter being electrically coupled to the plurality of substantially-planar spiral-filters, an orientation of a winding axis of the plurality of substantially-planar spiral-filters being substantially transverse to a winding axis of the solenoid RF filter, the RF filter device being configured to be coupled to a plasma-based processing system.

22. The radio-frequency filter (RF) device of claim 21, wherein each of the plurality of substantially-planar spiral filters is based on an air-core design.

23. The radio-frequency filter (RF) device of claim 21, wherein each of the substantially-planar spiral filters is arranged to increase constructive interference of magnetic paths between adjacent ones of the substantially-planar spiral filters.

24. A radio-frequency (RF) filter device, comprising:

a plurality of substantially-planar spiral-filters electrically coupled to each other in a spaced-apart arrangement, each of the plurality of substantially-planar spiral-filters being coupled alternately to an adjacent one of the substantially-planar spiral-filters in an inside-to-outside electrical connection and an outside-to-inside electrical connection, the alternating inside-to-outside and outside-to-inside connections to provide constructively-interfering magnetic paths, the plurality of substantially-planar spiral-filters being arranged in a successive configuration, each of the substantially-planar spiral-filters being wound in a same direction from a perspective of a given end of the coil; and a solenoid RF filter, the solenoid RF filter being electrically coupled to the plurality of substantially-planar spiral-filters, an orientation of a winding axis of the plurality of substantially-planar spiral-filters being substantially transverse to a winding axis of the solenoid RF filter, the RF filter device being configured to be coupled to a plasma-based processing system.

\* \* \* \* \*